(12) United States Patent
Pycroft et al.

(10) Patent No.: US 8,866,002 B1
(45) Date of Patent: Oct. 21, 2014

(54) THROUGH WAFER VIA STRUCTURES FOR CONCENTRATED PHOTOVOLTAIC CELLS

(75) Inventors: Garry Pycroft, San Jose, CA (US); Bob-Shih Wei Kuo, Chandler, AZ (US); Frederick Reed, Raleigh, NC (US)

(73) Assignee: Amkor Technology, Inc., Chandler, AZ (US)

( * ) Notice: Subject to any disclaimer, the term of this patent is extended or adjusted under 35 U.S.C. 154(b) by 898 days.

(21) Appl. No.: 12/626,512

(22) Filed: Nov. 25, 2009

(51) Int. Cl.
*H01L 31/00* (2006.01)

(52) U.S. Cl.
USPC .......................................... 136/252

(58) Field of Classification Search
USPC .......... 136/243, 244, 252, 251, 256, 259, 246
See application file for complete search history.

(56) References Cited

U.S. PATENT DOCUMENTS

| | | | |
|---|---|---|---|
| 4,257,823 A | 3/1981 | Bevilaqua et al. | |
| 5,622,873 A | 4/1997 | Kim et al. | |
| 6,005,287 A | 12/1999 | Kaiya et al. | |
| 6,013,935 A | 1/2000 | Shie | |
| 6,040,620 A | 3/2000 | Sugimoto | |
| 6,650,004 B1 | 11/2003 | Horie | |
| 6,756,658 B1 | 6/2004 | Gillett | |
| 6,794,740 B1 | 9/2004 | Edwards et al. | |
| 6,815,244 B2 | 11/2004 | Bottner et al. | |
| 6,844,615 B1 | 1/2005 | Edwards et al. | |
| 6,897,567 B2 | 5/2005 | Horie et al. | |
| 7,001,799 B1 | 2/2006 | Edwards et al. | |
| 7,002,241 B1 | 2/2006 | Mostafazadeh | |
| 8,093,675 B2 * | 1/2012 | Tsunemi et al. | 257/448 |
| 2005/0161777 A1 | 7/2005 | Horie | |
| 2006/0006506 A1 | 1/2006 | Watanabe et al. | |
| 2009/0126788 A1 * | 5/2009 | Hishida et al. | 136/256 |

FOREIGN PATENT DOCUMENTS

| | | | | |
|---|---|---|---|---|
| WO | WO 2007/099955 | * | 9/2007 | H01L 31/04 |
| WO | WO 2009/028287 | * | 3/2009 | H01L 31/04 |

* cited by examiner

*Primary Examiner* — Alexander Kollias
(74) *Attorney, Agent, or Firm* — Kevin B. Jackson

(57) ABSTRACT

In accordance with the present invention, there is provided multiple embodiments of a concentrated photovoltaic (CPV) receiver cell or die. In each embodiment of the present invention, the receiver die includes a multiplicity of through wafer vias or TWV's which are etched therethrough to effectively eliminate the bus bars on the top or front surface of the receiver die, connectors such as bus bars instead being effectively moved to the bottom or back surface of the receiver die. The movement of the connectors to the back surface of the receiver die provides the potential for a greater active surface area on the front surface for solar input.

20 Claims, 4 Drawing Sheets

THROUGH WAFER VIA STRUCTURES FOR CONCENTRATED PHOTOVOLTAIC CELLS

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Technical Field of the Invention

The present invention relates generally to semiconductor devices, and more particularly to a concentrated photovoltaic (CPV) receiver cell which includes through silicon via (TSV) or through wafer via (TWV) structures etched therethrough to create a connector at the base of the cell, thus providing the cell with greater surface area for solar input.

2. Description of the Related Art

Photovoltaic cells are a well known means for producing electrical current from electromagnetic radiation. Traditional photovoltaic cells comprise junction diodes fabricated from appropriately doped semiconductor materials. Such devices are typically fabricated as thin, flat wafers with the junction formed parallel to and near one of the flat surfaces. Photovoltaic cells are intended to be illuminated through their so-called "front" surface. Electromagnetic radiation absorbed by the semiconductor produces electron-hole pairs in the semiconductor. These electron-hole pairs may be separated by the electric field of the junction, thereby producing a photocurrent. Currently known photovoltaic cells typically have a generally quadrangular (e.g., square) configuration defining four peripheral side edges, and include a pair of bus bars which are disposed on the top or front surface and extend along respective ones of an opposed pair of the side edges. The bus bars are used to facilitate the electrical connection of the photovoltaic cell to another structure, as described in more detail below.

There is currently known in the electrical arts semiconductor devices known as CPV receiver die packages or modules. Currently known CPV modules typically comprise a ceramic substrate having a conductive pattern disposed on one side or face thereof. Attached to the substrate and electrically connected to the conductive pattern are electrical components, including a pair of preformed wire connectors and a packaged diode. Also attached to the substrate and electrically connected to the conductive pattern thereof is a CPV receiver cell or die. The electrical connection between the receiver die and the conductive pattern is often facilitated by a pair of punched thin metal foil or braided ribbon/mesh connectors which extend along and are welded or soldered to respective ones of opposed sides of the receiver die, which typically has a quadrangular or square configuration as indicated above. More particularly, the pair of punched thin metal foils or braided ribbon/mesh connectors are welded or soldered to respective ones of the bus bars on the top or front surface of the receiver die. In certain existing CPV modules, the electrical connection of the receiver die to the conductive pattern is facilitated by the use of multiple wires bonded to the bus bars on the front surface of the receiver die and the bond pads of the conductive pattern of the substrate, the wires being used as an alternative to the aforementioned braided ribbon or mesh interconnects. The CPV module may further include a light concentration means which is adapted to concentrate solar radiation onto the front surface of the receiver die.

Current CPV receiver die packages or modules typically generate up to ten amps of electrical current. In order to carry such high current, the above-described ribbons made of metal foil or braided wire mesh, or the above-described multiple bond wire bonds are used to form the interconnection between the bus bars on the front surface of the receiver die and the bond pads of the conductive pattern on the substrate. However, the use of the ribbon/mesh type interconnects or, alternatively, the bond wires give rise to certain deficiencies in currently known CPV modules which detract from their overall utility. More particularly, the ribbon/mesh type interconnects do not have good shape control for automatic pick up, and require the use of specialized welding equipment for the fabrication of the CPV module using the same. Stated another way, it is often difficult to control the shape of the ribbon/mesh type interconnects for automatic pick up and placement, with the fabrication process being mostly done through the use of special welding equipment or manual soldering which is more labor intensive and thus more costly. When wires are used as an alternative to the ribbon/mesh type interconnects, such wires require encapsulation protection for long-term reliability of the CPV module including the same. In addition, in those CPV modules including bond wires, problems may arise in relation to current crowding if too few wires are used. As indicated above, the wires also require encapsulation, over-molding, or other protection from the environment. Moreover, the use of the soldered or welded ribbon/mesh interconnects or bond wires create concerns regarding the electrical current carrying capability of the CPV module including the same.

As indicated above, the inclusion of the bus bars on the front surface of the receiver cell or die necessitates that the above-described ribbons made of metal, foil or braided wire mesh, or bond wires, be used to facilitate the electrical connection of the receiver die to the bond pads of the conductive pattern on the underlying substrate. In addition to the use of the ribbon/mesh type interconnects or wires giving rise to the deficiencies highlighted above, further penalties in the potential performance of the receiver die are directly attributable to the inclusion of the bus bars on the top or front surface of the receiver die. More particularly, in currently known concentrated photovoltaic receiver cells or dies, a certain percentage of the total area of the front surface of the receiver die is covered by the bus bars. That percentage of the total die area of the front surface covered by the bus bars is typically in the range of from about 8% to about 10%. As will be recognized, the active area of the front surface as a percentage of the overall die area thereof is thus reduced by an amount equal to the percentage of the area covered by the bus bars. In this regard, the active area as a percentage of the overall die area of the front surface could be substantially increased and the receiver die thus made more efficient if the bus bars on the front surface were effectively eliminated from the receiver die.

The present invention addresses these and other shortcomings of prior art CPV receiver dies by providing a concentrated photovoltaic receiver cell or die wherein an etching process is used to create through wafer vias or TWV's through the receiver die. The TWV's in turn are used to create connectors at the back or bottom surface of the receiver die, thus eliminating the need for the bus bars on the front surface thereof. The movement of the connectors (e.g., bus bars) to the bottom surface of the receiver die provides the potential for a greater active surface area on the front surface for solar input. The movement of the connectors to the bottom surface of the receiver die also effectively eliminates the need for top side connectors such as the aforementioned ribbon/mesh type interconnects or wires, thus allowing for easier top side connection for prisms or other optical input devices. Thus, the receiver die constructed in accordance with the present invention provides an increased top, active surface area ratio, which provides higher wafer utilization and higher power per area efficiency. Additionally, as indicated above, the elimination of the external wires or mesh/ribbon interconnects provides a reliability enhancements and/or manufacturing economies. These and other features of the present invention will be described in more detail below.

SUMMARY OF THE INVENTION

In accordance with the present invention, there is provided multiple embodiments of a concentrated photovoltaic (CPV) receiver cell or die. In each embodiment of the present invention, the receiver die includes a multiplicity of through wafer vias or TWV's which are etched therethrough to effectively eliminate the bus bars on the top or front surface of the receiver die, connectors such as bus bars instead being effectively moved to the bottom or back surface of the receiver die. The movement of the connectors to the back surface of the receiver die provides the potential for a greater active surface area on the front surface for solar input.

In a first embodiment of the present invention, the bus bars on the front surface of the receiver die are eliminated in favor of two rows or sets of TWV pads. The TWV pads of each set extend along respective ones of an opposed pair of the peripheral edge segments of the receiver die which has a generally quadrangular (e.g., square) configuration. The two sets of TWV pads are further arranged such that each TWV pad of one set is linearly aligned with or disposed in opposed relation to a corresponding TWV pad of the remaining set. Each of these corresponding pairs of the TWV pads is interconnected by one or more fine Ag wires. Though the TWV pads of the two sets thereof included on the front surface of the receiver die collectively take up or cover a prescribed percentage of the available surface area of the front surface, they provide a space savings in comparison to that area which is taken up by the two bus bars in existing CPV receiver die designs.

In the receiver die of the first embodiment, each of the TWV's has a first or top end which extends and is electrically connected to a respective one of the TWV pads on the front surface, and an opposed second or bottom end which extends and is electrically to a connector disposed on the back surface. Thus, like the TWV pads, the TWV's are also segregated into two sets which extend along and in close proximity to respective ones of the aforementioned opposed pair of the peripheral edge segments of the receiver die. Each of the TWV's preferably comprises a conductive plug which is surrounded by a suitable passivation to effectively eliminate conductive contact between the conductive plug and the Ge substrate of the receiver die. In the first embodiment, the bottom ends of the TWV's of each set are electrically connected to respective ones of a pair of bus bars which extend along respective ones of the aforementioned opposed pair of peripheral edge segments of the receiver die in spaced, generally parallel relation to each other. In a variant of the first embodiment, the bottom end of each TWV may extend and be electrically connected to a dedicated pad rather than a bus bar. In this instance, the pads on the back surface of the receiver die will thus also be segregated into two sets which extend along and in close proximity to respective ones of the aforementioned opposed pair of the peripheral edge segments of the receiver die.

In a second embodiment of the present invention, the TWV pads included on the front surface of the receiver die are eliminated, with the Ag wires (which extend in spaced, generally parallel relation to each other) instead spanning the entire width of the receiver die, i.e., extending between the aforementioned opposed pair of the peripheral edge segments of the receiver die. In the receiver die of the second embodiment, the TWV's are, like the TWV's of the first embodiment, segregated into two sets which extend along and in close proximity to respective ones of the aforementioned opposed pair of the peripheral edge segments of the receiver die. The two sets of TWV's are further arranged such that each TWV of one set is linearly aligned with or disposed in opposed relation to a corresponding TWV of the remaining set. Additionally, each of the TWV's (which is identically configured to those of the first embodiment) has a first or top end, with the top ends of the TWV's of each corresponding pair extending and being electrically connected to respective ones of the opposed end portions of a corresponding one of the Ag wires on the front surface of the receiver die.

In addition to the top end, each of the TWV's of the second embodiment defines a second or bottom end which extends and is electrically to a connector disposed on the back surface of the receiver die. More particularly, in the second embodiment, the bottom ends of the TWV's of each set are electrically connected to respective ones of a pair of bus bars which extend along respective ones of the aforementioned opposed pair of peripheral edge segments of the receiver die in spaced, generally parallel relation to each other. In one variant of the second embodiment, the bottom end of each TWV may extend and be electrically connected to a dedicated pad rather than a bus bar. In this instance, the pads on the back surface of the receiver die will thus also segregated into two sets which extend along and in close proximity to respective ones of the aforementioned opposed pair of the peripheral edge segments of the receiver die. In another variant of the second embodiment, the TWV's of both sets may be arranged in a staggered pattern relative to each other such that each Ag wire includes only a single TWV extending into electrical connection thereto.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
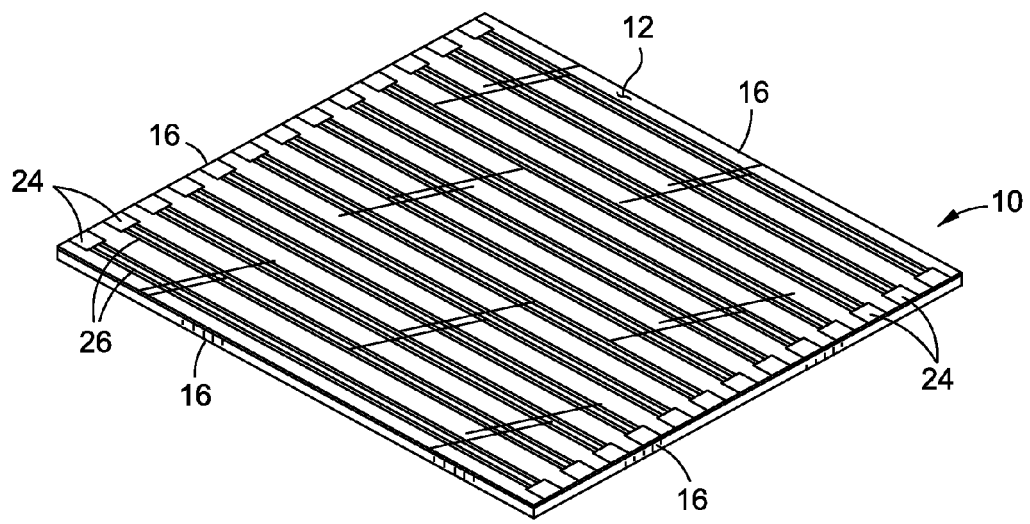
FIG. 1 is a top perspective view of a CPV receiver cell or die constructed in accordance with a first embodiment of the present invention.
Figure 2:
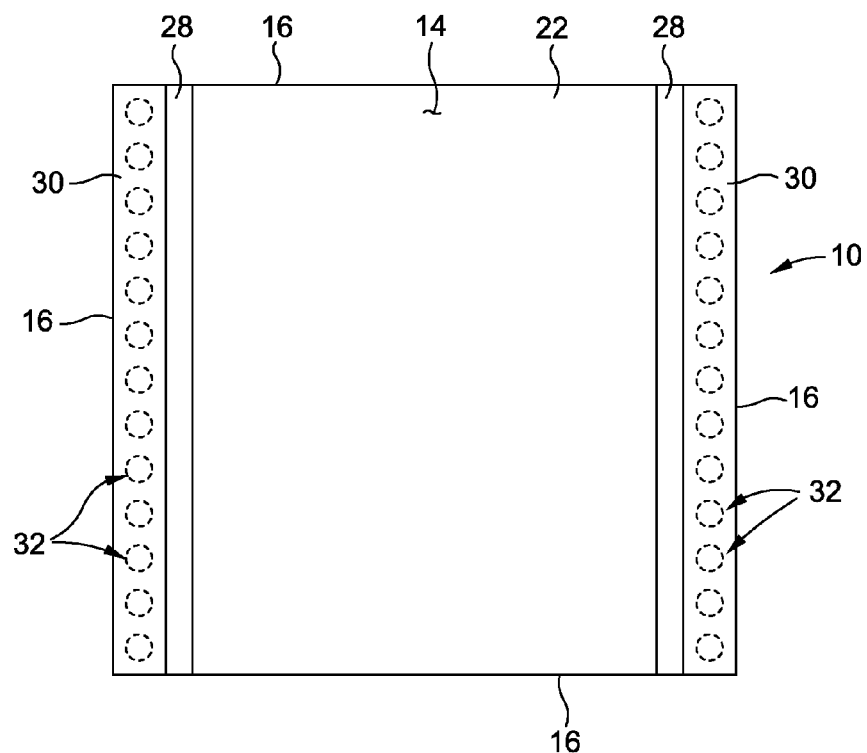
FIG. 2 is a bottom plan view of the receiver die shown in FIG. 1.
Figure 3:
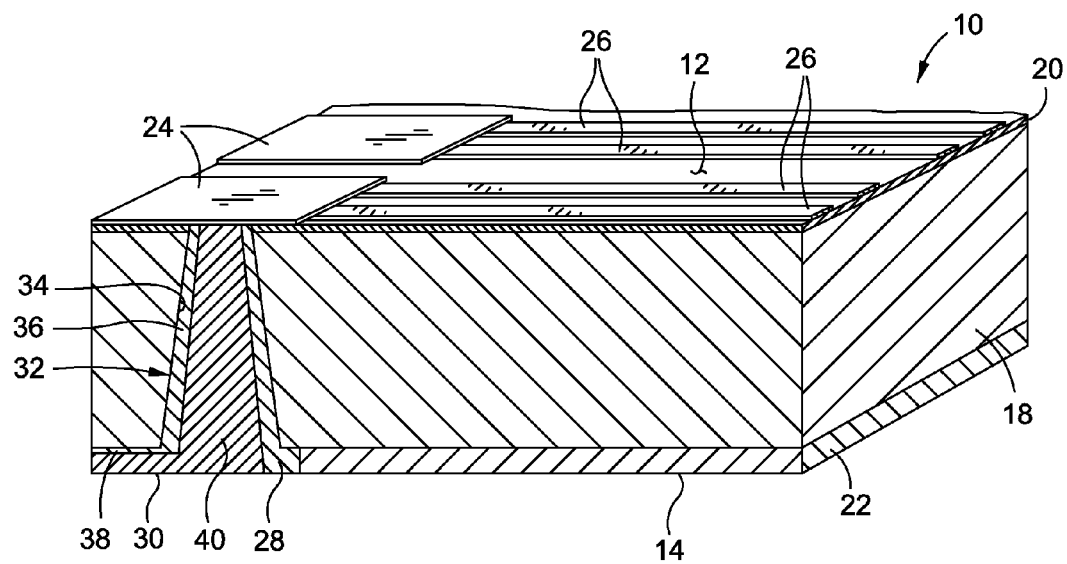
FIG. 3 is an enlarged, partial cross-sectional view of the receiver die shown in FIG. 1.

Referring now to the drawings wherein the showings are for purposes of illustrating preferred embodiments of the present invention only, and not for purposes of limiting the same, FIGS. 1-3 depict a CPV receiver cell or die 10 constructed in accordance with a first embodiment of the present invention. The receiver die 10 has a generally quadrangular (e.g., square) configuration, and defines a generally planar top or front surface 12 and an opposed, generally planar bottom or back surface 14. In addition, the receiver die 10 defines four (4) generally straight peripheral edge segments 16.

As best seen in FIG. 3, the receiver die 10 is fabricated from a number of layers, including a generally planar Ge substrate 18 having at least one active layer 20 applied to one side or face thereof, and a metalized layer 22 or metallization applied to the remaining, opposed side or face thereof. In this regard, the front surface 12 of the receiver die 10 is actually defined by the active layer 20, with the majority of the back surface 14 being defined by the metalized layer 22.

In the receiver die 10, two rows or sets of via pads 24, and more particularly through wafer via or TWV pads 24 are formed on the front surface 12 defined by the active layer 20. As best seen in FIG. 1, the TWV pads 24 of each set extend along respective ones of an opposed pair of the peripheral edge segments 16 defined by the receiver die 10. The two sets of TWV pads 24 are further arranged such that each TWV pad 24 of one set is linearly aligned with or disposed in opposed relation to a corresponding TWV pad 24 of the remaining set. In FIG. 1, thirteen (13) TWV pads 24 are depicted as being included in each set thereof. However, those of ordinary skill in the art will recognize that this number of TWV pads 24 in each set is exemplary only, and may be increased or decreased without departing from the spirit and scope of the present invention. However, it will also be recognized that in the receiver die 10, the number of TWV pads 24 included in one set will be equal to the number included in the remaining set. Additionally, as shown in FIGS. 1 and 3, each of the TWV pads 24 is depicted as having a generally quadrangular (e.g., square) configuration, with one of the peripheral edge segments of each TWV pad 24 of each set extending along and in substantially flush relation to a respective one of the opposed pair of the peripheral edge segments 26 along which the two sets of TWV pads 24 extend as described above. However, those of ordinary skill in the art will also recognize that each of the TWV pads 24 of each set thereof may be formed to have an alternative shape or configuration without departing from the spirit and scope of the present invention.

As further seen in FIGS. 1 and 3, each of the corresponding pairs of the TWV pads 24 is interconnected by one or more fine Ag wires 26 which are formed on the front surface 12 defined by the active layer 20, and are arranged so as to extend in spaced, generally parallel relation. In FIGS. 1 and 3, two (2) wires 26 are shown as extending between and interconnecting each corresponding pair of the TWV pads 24. However, those of ordinary skill in the art will recognize that fewer or greater than two wires 26 may be extended between each corresponding pair of TWV pads 24 without departing from the spirit and scope of the present invention.

Referring now to FIGS. 2 and 3, as indicated above, the majority of the back surface 14 of the receiver die 10 is defined by the metalized layer 22. In addition to the metalized layer 22, the back surface 14 is further partially defined by an opposed pair of elongate passivation strips 28 which are formed on that side or face of the substrate 18 having the metalized layer 22 applied thereto. As best seen in FIG. 2, the passivation strips 28 extend in spaced, generally parallel relation to each other and to those peripheral edge segments 16 of the opposed pair along which the two sets of TWV pads 24 extend. The passivation strips 28 also extend along and abut respective ones of an opposed pair of the peripheral edge segments defined by the metalized layer 22. The back surface 14 of the receiver die 10 is further partially defined by an opposed pair of elongate bus bars 30 which also extend in spaced, generally parallel relation to each other and along respective ones of the peripheral edge segments 16 of the opposed pair along which the two sets of the TWV pads 24 extend. As seen in FIG. 2, the bus bars 30 also extend along and abut respective ones of the passivation strips 28, i.e., each passivation strip 28 is captured between the metalized layer 22 and one of the bus bars 30. The bus bars 30 are each fabricated from a conductive metal material layer which is applied to the same side or face of the substrate 18 having the metalized layer 22 and passivation strips 28 applied thereto. As will be recognized, due to the fabrication of both the metalized layer 22 and bus bars 30 from a conductive metal material, the passivation strips 28 effectively electrically isolate or insulate the bus bars 30 from the metalized layer 22 which is positioned therebetween. As is apparent from the foregoing, the back surface 14 of the receiver die 10 is collectively defined by the metalized layer 22, passivation strips 28 and bus bars 30.

The receiver die 10 of the present invention further comprises a multiplicity of through wafer vias or TWV's 32 which are formed therein. More particularly, each of the TWV's 32 comprises an aperture 34 which has a tapered, generally frusto-conical profile and extends through the substrate 18 and active layer 20. It is contemplated that the majority of each aperture 34 will be formed by subjecting the substrate 18 to a suitable etching or laser drilling process. Each aperture 34 is effectively lined or coated with a passivation layer 36. As best seen in FIG. 3, a portion of the passivation layer 36 lining the aperture 34 of each TWV 32 is integrally connected to a respective one of the passivation strips 28. In addition, a portion of the passivation layer 36 lining the aperture 34 of each TWV 32 is integrally connected to a respective one of a pair of elongate, interior passivation strips 38 of the receiver die 10. The interior passivation strips 38 of the receiver die 10 also extend in spaced, generally parallel relation to each other along respective ones of the opposed pair of the peripheral edge segments 16 along which the two sets of the TWV pads 24 and the two bus bars 30 extend. As best seen in FIG. 3, each of the interior passivation strips 38 is used to provide an insulative barrier between the substrate 18 and portions of respective ones of the bus bars 30.

In addition to the aperture 34 and passivation layer 36, each of the TWV's 32 comprises a conductive metal plug 40 which is filled into the aperture 34, and in particular the passivation layer 36 lining the same. When viewed from the perspective shown in FIG. 3, the plug 40 of each TWV 32 has a first or top end which extends and is electrically connected to a respective one of the TWV pads 24 on the front surface 12. In addition to the top end, each plug 40 has an opposed, second or bottom end which extends and is electrically connected to a respective one of the bus bars 30. Thus, like the TWV pads 24, the TWV's 32 are also segregated into two sets which extend along and in close proximity to respective ones of the opposed pair of the peripheral edge segments 16 of the receiver die 10 along which the two sets of TWV pads 24 and the bus bars 30 extend. As will be recognized, the passivation layer 36 of each TWV 32 effectively eliminates conductive contact between the corresponding plug 40 and the surrounding substrate 18. In the receiver die 10, it is contemplated that the TWV's 32 will be formed prior to the formation of the bus bars 30. In this regard, the metal material filled into the aperture 34 lined with the passivation layer 36 to form the plug 40 may also be used to form a respective one of the bus bars 30, thus resulting in the plugs 40 of each set of the TWV's 32 being integrally connected to a respective one of the bus bars 30 in the manner shown in FIG. 3.

In the receiver die 10 constructed in accordance with the present invention, the TWV pads 24 of the two sets thereof included on the front surface 12 collectively take up or cover a prescribed percentage of the available surface area of the front surface 12. However, the TWV pads 24 on the front surface provide a space savings in comparison to that area which is taken up by the two bus bars included on the front surface of existing CPV receiver die designs. More particularly, that percentage of the total die area of the front surface 12 which would normally be covered by bus bars in a prior art CPV receiver die design is typically in the range of from about 8% to about 10%. In comparison, that percentage of the total die area of the front surface 12 covered by the TWV pads 24 is typically in the range of from about 0.5% to about 1.0%, thus resulting in a substantial increase in the active area of the front surface 12 as a percentage of the overall die area of such front surface 12.

Figure 7:
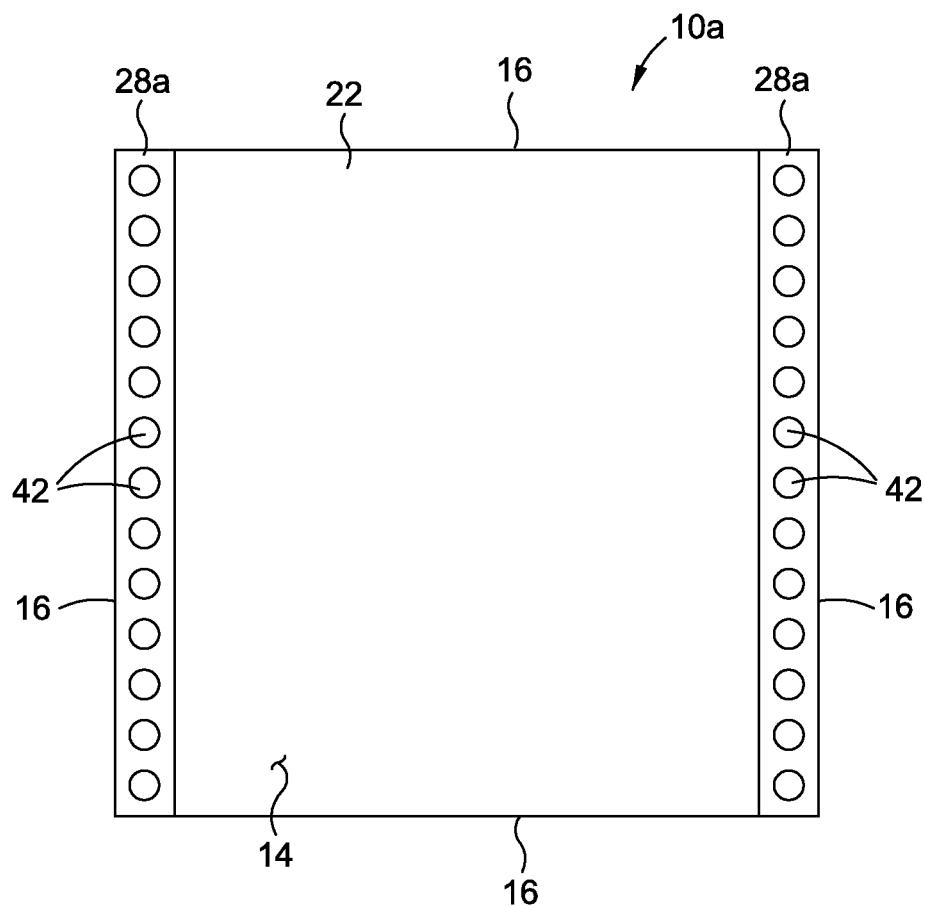
FIG. 7 is a bottom plan view of a second variant of the receiver die of the second embodiment shown in FIG. 4, and a first variant of the receiver die of the first embodiment shown in FIG. 1.

Referring now to FIG. 7, there is shown a bottom plan view of a receiver die 10a which is formed as a first variant of the receiver die 10 shown and described above in relation to FIGS. 1-3. The primary distinction between the receiver dies 10, 10aa ties in the substitution of the bus bars 30 of the receiver die 10 with two rows or sets of pads 42. The pads 42 of each set extend along and in close proximity to respective ones of the opposed pair of the peripheral edge segment 16 of the receiver die 10a along which the TWV pads 24 extend. In the receiver die 10a, the bottom end of each TWV 32, and in particular the plug 40 thereof, extends and is electrically connected to a respective one of the pads 42 of a corresponding set thereof. Thus, each TWV pad 24 of each set is electrically connected to a respective one of the pads 42 of a corresponding set by a respective one of the TWV's 32. Accordingly, the number of pads 42 corresponds to the number of TWV's 32, which in turn corresponds to the number of TWV pads 24 included in the receiver die 10a. In FIG. 7, each of the pads 42 is shown as having a generally circular configuration. However, those of ordinary skill in the art will recognize that the pads 42 may be formed to have other shapes (e.g., quadrangular or square) without departing from the spirit and scope of the present invention.

A further distinction between the receiver dies 10, 10a lies in the configuration of the passivation strips 28a of the receiver die 110a in comparison to the passivation strips 28 of the receiver die 10. More particularly, in the receiver die 10a, each of the passivation strips 28a extends along and abuts a respective one of an opposed pair of the peripheral edge segments defined by the metalized layer 22. However, each of the passivation strips 28a also extends along and in substantially flush relation to a respective one of the opposed pair of the peripheral edge segments 16 along which the TWV pads 24 extend. As such, as seen in FIG. 7, each set of the pads 42 is effectively positioned upon an extends along the approximate center of a respective one of the two passivation strips 28a. The passivation strips 28a thus effectively facilitate the electrical isolation or insulation of the pads 42 of each set from the metalized layer 22 which is positioned between the two sets of pads 42.

Figure 4:
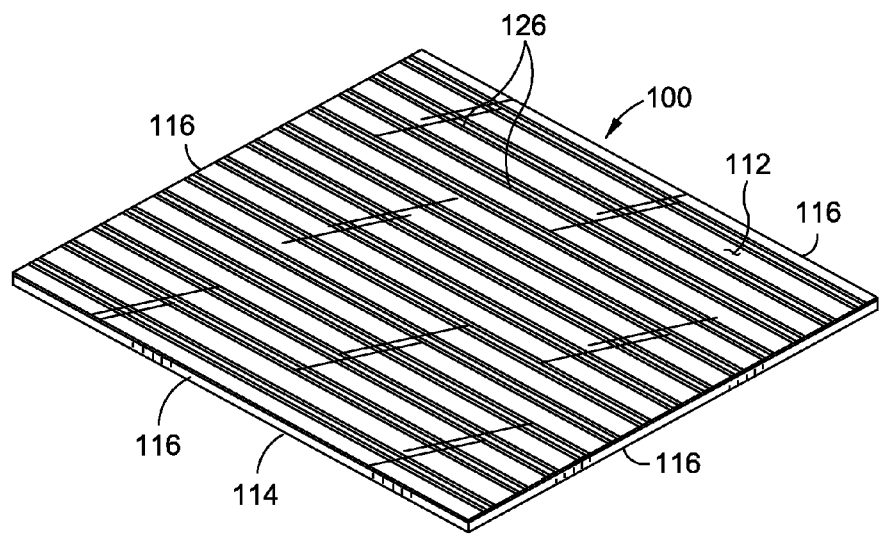
FIG. 4 is a top perspective view of a CPV receiver cell or die constructed in accordance with a second embodiment of the present invention.
Figure 5:
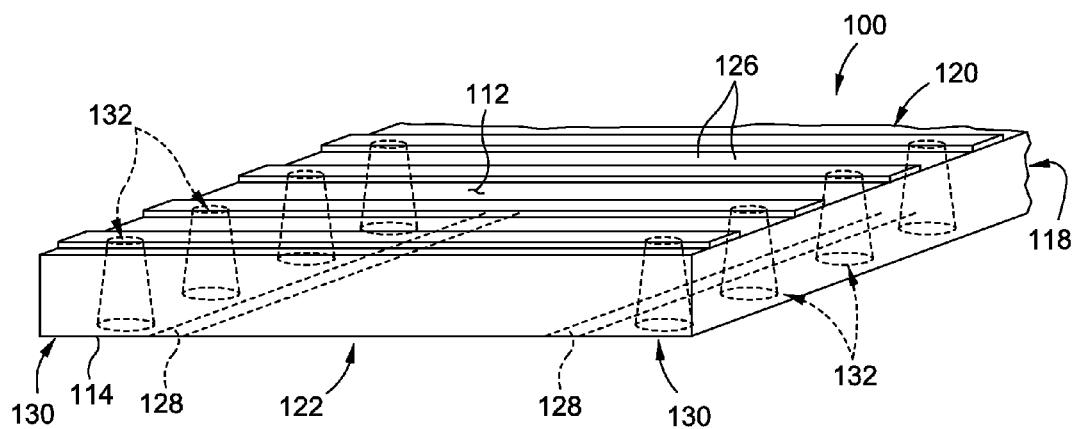
FIG. 5 is an enlarged, partial top perspective view of the receiver die shown in FIG. 4, further illustrating in phantom the through wafer vias or TWV's thereof.

Referring now to FIGS. 4 and 5, there is shown a CPV receiver cell or die 100 constructed in accordance with a second embodiment of the present invention. The receiver die 100 has a generally quadrangular (e.g., square) configuration, and defines a generally planar top or front surface 112 and an opposed, generally planar bottom or back surface 114. In addition, the receiver die 100 defines four (4) generally straight peripheral edge segments 116. Like the receiver die 10, the receiver die 100 is fabricated from a number of layers, including a generally planar Ge substrate 118 having at least one active layer 120 applied to one side or face thereof, and a metalized layer 122 or metallization applied to the remaining, opposed side or face thereof. In this regard, the front surface 112 of the receiver die 100 is defined by the active layer 120, with the majority of the back surface 114 being defined by the metalized layer 122. In the receiver die 100, a multiplicity of fine Ag wires 126 are formed on the front surface 112 defined by the active layer 120, and are arranged so as to extend in spaced, generally parallel relation between an opposed pair of the peripheral edge segments 116.

As best seen in FIG. 5, as indicated above, the majority of the back surface 114 of the receiver die 100 is defined by the metalized layer 122. In addition to the metalized layer 122, the back surface 114 is further partially defined by an opposed pair of elongate passivation strips 128 which are formed on that side or face of the substrate 118 having the metalized layer 122 applied thereto. The passivation strips 128 extend in spaced, generally parallel relation to each other and to those peripheral edge segments 116 of the opposed pair between which the wires 126 extend. The passivation strips 128 also extend along and abut respective ones of an opposed pair of the peripheral edge segments defined by the metalized layer 122. The back surface 114 of the receiver die 100 is further partially defined by an opposed pair of elongate bus bars 130 which also extend in spaced, generally parallel relation to each other and along respective ones of the peripheral edge segments 116 of the opposed pair between which the wires 126 extend. The bus bars 130 also extend along and abut respective ones of the passivation strips 128, i.e., each passivation strip 128 is captured between the metalized layer 122 and one of the bus bars 130. The bus bars 130 are each fabricated from a conductive metal material layer which is applied to the same side or face of the substrate 118 having the metalized layer 122 and passivation strips 128 applied thereto. As will be recognized, due to the fabrication of both the metalized layer 122 and bus bars 130 from a conductive metal material, the passivation strips 128 effectively electrically isolate or insulate the bus bars 130 from the metalized layer 122 which is positioned therebetween. As is apparent from the foregoing, the back surface 114 of the receiver die 100 is collectively defined by the metalized layer 122, passivation strips 128 and bus bars 130.

The receiver die 100 further comprises a multiplicity of through wafer vias or TWV's 132 which are formed therein and identically configured to the above-described TWV's 32 of the receiver die 10 (i.e., formed from an aperture 34 lined with a passivation layer 36 and filled with a conductive metal plug 40). A portion of the passivation layer lining the aperture of each TWV 132 is integrally connected to a respective one of the passivation strips 128. In addition, a portion of the passivation layer lining the aperture of each TWV 132 is integrally connected to a respective one of a pair of elongate, interior passivation strips of the receiver die 100 which, though not shown in FIGS. 4 and 5, are identically configured to and minor the functional attributes of the interior passivation strips 38 of the receiver die 10. In this regard, the interior passivation strips of the receiver die 100 also extend in spaced, generally parallel relation to each other along respective ones of the opposed pair of the peripheral edge segments 116 between which the wires 126 extend.

In the receiver die 100, the TWV's 132 are segregated into two sets which extend along and in close proximity to respective ones of the opposed pair of the peripheral edge segments 116 of the receiver die 100 between which the wires 126 extend. The two sets of TWV's 132 are further arranged such that each TWV 132 of one set is linearly aligned with or disposed in opposed relation to a corresponding TWV 132 of the remaining set. In this regard, the plugs of the TWV's 132 of each corresponding pair each have a first or top end which extends and is electrically connected to an end portion of a respective one on the wires 126, i.e., each of the wires 126 has a corresponding pair of the TWV's 132 electrically connected to respective ones of the opposed end portions thereof. In addition to the top end, the plug of each TWV 132 has an opposed, second or bottom end which extends and is electrically connected to a respective one of the bus bars 130. As in the receiver die 10, in the receiver die 100, it is also contemplated that the TWV's 132 will be formed prior to the formation of the bus bars 130, thus resulting in the plugs of each set of the TWV's 132 being integrally connected to a respective one of the bus bars 130.

In the receiver die 100, the complete elimination of any bus bars on the front surface as occurs in existing CPV receiver die designs provides a substantial increase in the active area of the front surface 112 as a percentage of the overall die area of such front surface 112. As indicated above, that percentage of the total die area of the front surface 112 which would normally be covered by bus bars in a prior art CPV receiver die design is typically in the range of from about 8% to about 10%. This loss of active area is, in large measure, eliminated in the receiver die 100 as a result of the bus bars 130 effectively being moved from the front surface 112 to the back surface 114.

Figure 6:
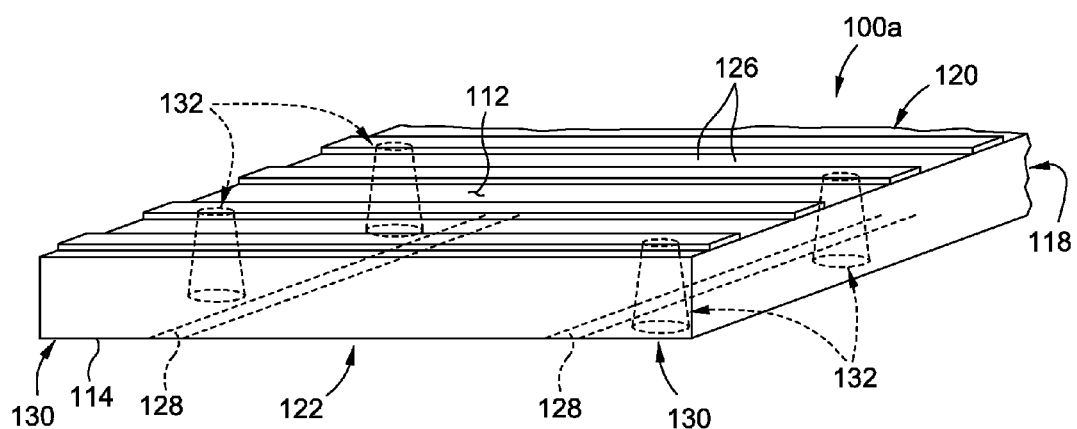
FIG. 6 is an enlarged, partial top perspective view of a first variant of the receiver die of the second embodiment shown in FIG. 4, further illustrating in phantom the through wafer vias or TWV's thereof.

Referring now to FIG. 6, there is shown a partial top perspective view of a receiver die 100a which is formed as a first variant of the receiver die 100 shown and described above in relation to FIGS. 4 and 5. The sole distinction between the receiver dies 100, 100a lies in the number and arrangement of the TWV's 132 of the receiver die 100a in comparison to those of the receiver die 100. More particularly, in the receiver die 100a, the TWV's 132 of both sets are arranged in a staggered pattern relative to each other such that each wire 126 includes only a single TWV 132 extending into electrical connection with one of the opposed end portions thereof, i.e., each wire 126 includes only a single TWV 132 electrically connected thereto.

It is also contemplated that the structural features of the receiver die 10a shown in FIG. 7 and described above as a variant to the receiver die 10 may also be applied to either of the receiver dies 100, 100a. In this regard, the bus bars 130 of the receiver dies 100, 100a may be substituted with the two rows or sets of pads 42 electrically connected to the bottom ends of the plugs of respective ones on the TWV's 132, with the passivation strips 128 being substituted with the passivation strips 28a.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A concentrated photovoltaic receiver die, comprising:
   a substrate comprising a pair of opposed peripheral edge segments;
   an active layer for solar input disposed on the substrate, wherein the active layer at least partially forms a front surface of the concentrated photovoltaic receiver die;
   conductive connectors disposed on the substrate, wherein the conductive connectors at least partially form a back surface of the concentrated photovoltaic receiver die;
   a plurality of wires disposed on the front surface, wherein the plurality of wires extend in a spaced, parallel relation to each other; and
   a plurality of vias, wherein the only vias present are the plurality of vias consisting of a spaced pair of a first single row and a second single row, wherein the plurality of vias extend along and in close proximity to the opposed pair of the peripheral edge segments, wherein each of the plurality of vias extend through the substrate and the active layer, and wherein the plurality of vias are sized and configured to electrically connect at least one of the plurality of wires to at least one of the conductive connectors.

2. The concentrated photovoltaic receiver die of claim 1, wherein the back surface is further partially defined by a metalized layer and a pair of passivation strips, and wherein the metallized layer and the pair of passivation strips are disposed on the substrate, and wherein the metalized layer is electrically insulted from the conductive connectors by the pair of passivation strips.

3. The concentrated photovoltaic receiver die of claim 1, wherein the conductive connectors comprise a spaced pair of bus bars, wherein the spaced pair of bus bars extend along the opposed pair of peripheral edge segments and wherein each of the plurality of vias electrically connect at least one of the plurality of wires to the spaced pair of bus bars.

4. The concentrated photovoltaic receiver die of claim 3, wherein each of the plurality of vias of the first single row is linearly aligned with one of the plurality of vias of the second row and wherein each of the plurality of wires is electrically connected to the each of the spaced pair of bus bars by a corresponding linearly aligned pair of the plurality of vias of the first and second single rows.

5. The concentrated photovoltaic receiver die of claim 3, wherein the plurality of vias of the first row are staggered relative to the plurality of vias of the second single row and wherein each of the plurality of wires is electrically connected to one of the spaced pair of bus bars by a via in the first single row or a via in the second single row one.

6. The concentrated photovoltaic receiver die of claim 1, wherein the conductive connectors comprise a plurality of pads segregated into only a spaced pair of first and second rows which extend along the opposed pair of peripheral edge segments in aligned relation to the plurality of vias and wherein each of the plurality of vias electrically connects at least one of the plurality of wires to one of the plurality of pads.

7. The concentrated photovoltaic receiver die of claim 6, wherein each of the plurality of vias of the first single row is linearly aligned with one of the plurality of vias of the second single row and wherein each of the plurality of wires is electrically connected to a pair of the plurality of pads by a corresponding linearly aligned pair of the plurality of vias of the first single row and second single row.

8. The concentrated photovoltaic receiver die of claim 6, wherein the plurality of vias of the first single row are staggered relative to the plurality of vias of the second single row, and each of the plurality of wires is electrically connected to one of the plurality of pads by a via in the first single row or a via in the second single row.

9. The concentrated photovoltaic receiver die of claim 1, further comprising:
   a plurality of via pads disposed on the front surface and segregated into only a spaced pair of first and second rows which extend along the opposed pair of peripheral edge segments in an aligned relation to the plurality of vias;
   each of the plurality of wires extend between and interconnect a corresponding pair of the plurality of via pads, wherein each of the plurality of vias is sized and configured to electrically connect the plurality of via pads to one of the conductive connectors.

10. The concentrated photovoltaic receiver die of claim 9, wherein each of the plurality of vias comprises:
    an aperture formed in and extending through the substrate and the active layer;
    a passivation layer lining the aperture; and
    a conductive metal plug disposed in the passivation layer, the conductive metal plug defining a first end and an opposed second end, wherein the first end is electrically connected to one of the plurality of via pads, and wherein the opposed second end is electrically connected to one of the conductive connectors.

11. The concentrated photovoltaic receiver die of claim 9, wherein the conductive connectors comprise a spaced pair of bus bars which extend along the opposed pair of peripheral edge segments, each of the plurality of vias electrically connect the plurality of via pads to the spaced pair of bus bars.

12. The concentrated photovoltaic receiver die of claim 11, wherein each of the plurality of via pads of the first row is linearly aligned with one of the plurality of via pads of the second row.

13. The concentrated photovoltaic receiver die of claim 9, wherein the conductive connectors comprise a plurality of pads segregated into only a spaced pair of first and second rows which extend along the opposed pair of peripheral edge segments in an aligned relation to of the plurality of vias, each of the plurality of vias electrically connects one of the plurality of via pads disposed on the front surface to one of the plurality of pads disposed on the back surface.

14. The concentrated photovoltaic receiver die of claim 13, wherein each of the plurality of via pads of the first row is linearly aligned with one of the plurality of via pads of the second row.

15. A concentrated photovoltaic receiver die, comprising:
    a pair of opposed peripheral edge segments;
    a front surface for solar input, wherein the front surface forms an active region;
    a back surface disposed in an opposed relation to the front surface, wherein the back surface partially forms a conductive connector structure;
    a metalized layer;
    a pair of passivation strips, wherein the metalized layer is electrically insulated from the conductive connector structure by the pair of passivation strips;
    a plurality of wires disposed on the front surface in spaced relation to each other; and
    a plurality of vias extending through the concentrated photovoltaic receiver die, wherein the only vias present are the plurality of vias consisting of a spaced pair of a first single row and a second single row, and wherein the spaced pair of first and second single rows extend along and in close proximity to the opposed pair of the peripheral edge segments, each of the plurality of vias is sized and configured to electrically connect at least one of the plurality of wires to the conductive connector structure.

16. The concentrated photovoltaic receiver die of claim 15, wherein the conductive connector structure comprises a plurality of pads.

17. The concentrated photovoltaic receiver die of claim 15, wherein the conductive connector structure comprises a pair of bus bars.

18. The concentrated photovoltaic receiver die of claim 15 further comprising:
    a plurality of via pads disposed on the front surface and segregated into only a spaced pair of first and second rows, wherein the spaced pair of first and second rows extends along the opposed pair of peripheral edge segments in aligned relation to the plurality of vias;
    each of the plurality of wires extend between and interconnect a corresponding pair of the plurality of via pads, wherein each of the plurality of vias is sized and configured to electrically connect one of the plurality of via pads to the conductive connector structure.

19. The concentrated photovoltaic receiver die of claim 15, wherein each of the plurality of vias comprises:
    an aperture extending between the front surface and the back surface;
    a passivation layer lining the aperture and integrally connected to one of the pair of passivation strips; and
    a conductive metal plug within the aperture.

20. The concentrated photovoltaic receiver die of claim 15, wherein the plurality of vias of the first row thereof are staggered relative to the plurality of vias of the second row, and wherein each of the plurality of wires is electrically connected to the conductive connective structure by a via in the first single row or a via in the second single row.

* * * * *